United States Patent
Wu et al.

(10) Patent No.: US 11,469,275 B2
(45) Date of Patent: Oct. 11, 2022

(54) DISPLAY PANEL AND DISPLAY DEVICE

(71) Applicant: WuHan TianMa Micro-Electronics CO., LTD., Wuhan (CN)

(72) Inventors: Fengyun Wu, Wuhan (CN); Yangzhao Ma, Wuhan (CN)

(73) Assignee: WuHan TianMa Micro-Electronics CO., LTD., Wuhan (CN)

( * ) Notice: Subject to any disclaimer, the term of this patent is extended or adjusted under 35 U.S.C. 154(b) by 33 days.

(21) Appl. No.: 16/859,636

(22) Filed: Apr. 27, 2020

(65) Prior Publication Data

US 2021/0265434 A1  Aug. 26, 2021

(30) Foreign Application Priority Data

Feb. 26, 2020  (CN) .......................... 202010121170.0

(51) Int. Cl.
*H01L 27/32* (2006.01)
*H01L 51/52* (2006.01)

(52) U.S. Cl.
CPC ...... *H01L 27/3234* (2013.01); *H01L 27/3218* (2013.01); *H01L 27/3272* (2013.01); *H01L 51/5281* (2013.01); *H01L 51/5284* (2013.01)

(58) Field of Classification Search
CPC ............. H01L 27/3234; H01L 27/3218; H01L 27/3272; H01L 51/5281
See application file for complete search history.

(56) References Cited

U.S. PATENT DOCUMENTS

| 2014/0354927 | A1* | 12/2014 | Kanno | ............. G02F 1/133504 349/112 |
|---|---|---|---|---|
| 2018/0342571 | A1* | 11/2018 | Kwon | ................. H01L 51/5221 |
| 2021/0191552 | A1* | 6/2021 | Bok | ...................... G06F 1/1658 |

FOREIGN PATENT DOCUMENTS

| CN | 104024931 A | 9/2014 |
|---|---|---|
| CN | 108933160 A | 12/2018 |

(Continued)

OTHER PUBLICATIONS

First Chinese Office Action dated Apr. 2, 2022 issued in corresponding Chinese Application No. 202010121170.0 filed on Feb. 26, 2020, and its English translation thereof, 20 pages.

*Primary Examiner* — Aaron J Gray
(74) *Attorney, Agent, or Firm* — Christensen O'Connor Johnson Kindness PLLC

(57) ABSTRACT

Provided is a display panel including a display area, which includes an optical component arrangement region including a light-blocking region and light-transmitting region units distributed in rows and columns. Each light-transmitting region unit includes first and second sets of light-transmitting regions that are arranged along a first direction. The first set of light-transmitting regions includes a first light-transmitting region and a second light-transmitting region arranged along a second direction, and the second set of light-transmitting region includes a third light-transmitting region and a fourth light-transmitting region arranged along the second direction. The first direction intersects with the second direction. Each light-transmitting region has a length direction. An angle formed between the length direction and the first direction is within a range of 10° to 40°. In each light-transmitting region unit, the length direction of each light-transmitting region points to an area surrounded by the first to fourth light-transmitting regions.

18 Claims, 10 Drawing Sheets

(56) References Cited

FOREIGN PATENT DOCUMENTS

| | | | | | |
|---|---|---|---|---|---|
| CN | 110189627 | A | | 8/2019 | |
| CN | 110783390 | A | | 2/2020 | |
| KR | 20210082316 | A | * | 7/2021 | ........... G06F 1/1684 |
| TW | I549291 | B | | 9/2016 | |

* cited by examiner

DISPLAY PANEL AND DISPLAY DEVICE

CROSS-REFERENCE TO RELATED APPLICATIONS

The present disclosure claims priority to Chinese Patent Application No. 202010121170.0, filed on Feb. 26, 2020, the content of which is incorporated herein by reference in its entirety.

TECHNICAL FIELD

The present disclosure relates to the field of display technologies, and in particular, to a display panel and a display device.

BACKGROUND

At present, an electronic device such as a cellphone or a tablet tends to be designed to have a high screen occupation ratio. The screen occupation ratio refers to a ratio of an area of a screen to an area of a front panel of the electronic device. Therefore, how to increase the screen occupation ratio has become a technical problem to be solved. In order to increase the screen ratio while achieving functions such as a front camera, a technology of setting an under-screen camera area in a screen display area has appeared. In addition to light-emitting devices configured to achieve a display function, a light-transmitting region is provided in the under-screen camera area, and the front camera can achieve the front camera function through the light-transmitting region in the under-screen area. However, currently, in the front camera area, a light diffraction phenomenon in the light-transmitting region is serious.

SUMMARY

Representative and non-limiting embodiments of the present disclosure provide a display panel and a display device, which can reduce a light diffraction degree of a light-transmitting region.

In an aspect, the present disclosure provides a display panel including a display area. The display area includes an optical component arrangement region. The optical component arrangement region includes at least one light-blocking region and a plurality of light-transmitting region units. The plurality of light-transmitting region units is distributed in rows and columns, and each of the plurality of light-transmitting region units includes a plurality of light-transmitting regions. Each of the plurality of light-transmitting region unit includes a first set of light-transmitting regions and a second set of light-transmitting regions that are arranged along a first direction. The first set of light-transmitting regions includes a first light-transmitting region and a second light-transmitting region that are arranged along a second direction, and the second set of light-transmitting region includes a third light-transmitting region and a fourth light-transmitting region that are arranged along the second direction. The first direction intersects with the second direction. Each of the plurality of light-transmitting regions has a length direction. An angle formed between the length direction and the first direction is within a range of 10° to 40°, and the range includes range 10° and 40°. In each of the plurality of light-transmitting region units, the length direction of each of the plurality of light-transmitting regions points to an area surrounded by the first light-transmitting region, the second light-transmitting region, the third light-transmitting region, and the fourth light-transmitting region.

In another aspect, based on a same inventive concept, an embodiment of the present disclosure further provides a display device, including the display panel described and an optical component provided at a position corresponding to the optical component arrangement region.

For the display panel and display device in the embodiments of the present disclosure, the light-transmitting region has a length direction, and an angle formed between the length direction of the light-transmitting region and the first direction is within a range of 10°-40°. In the light-transmitting region unit, the length direction of each light-transmitting region points to the area surrounded by the first light-transmitting region, the second light-transmitting region, the third light-transmitting region, and the fourth light-transmitting region. With an arrangement of the light-transmitting region and angle setting of the length direction of the light-transmitting region, the light diffraction degree of the light-transmitting region can be reduced, thereby improving an imaging effect of the front camera through the light-transmitting region.

BRIEF DESCRIPTION OF DRAWINGS

In order to more clearly illustrate technical solutions in embodiments of the present disclosure or in the related art, the accompanying drawings used in the embodiments and in the related art are briefly introduced as follows. It should be noted that the drawings described as follows are representative embodiments of the present disclosure.

DESCRIPTION OF EMBODIMENTS

In order to make the purpose, technical solutions, and advantages of the embodiments of the present disclosure be understandable, the technical solutions in the embodiments of the present disclosure are described in the following with reference to the accompanying drawings.

The terms used in the embodiments of the present disclosure are for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

Figure 1:
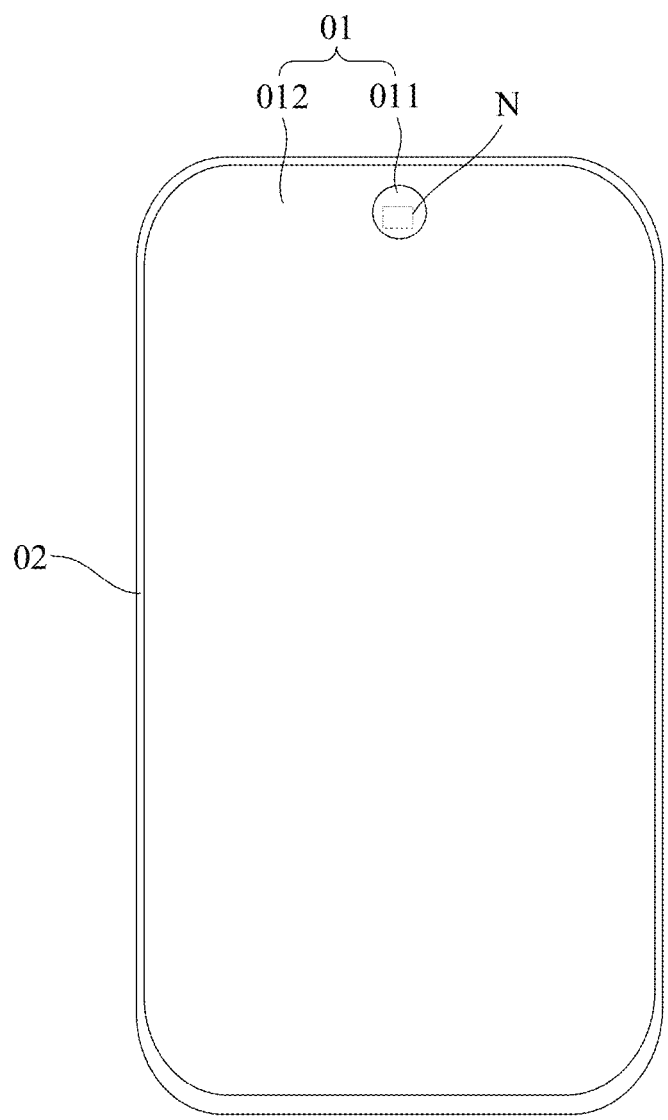
FIG. 1 is a top view of a display panel according to an embodiment of the present disclosure.
Figure 2:
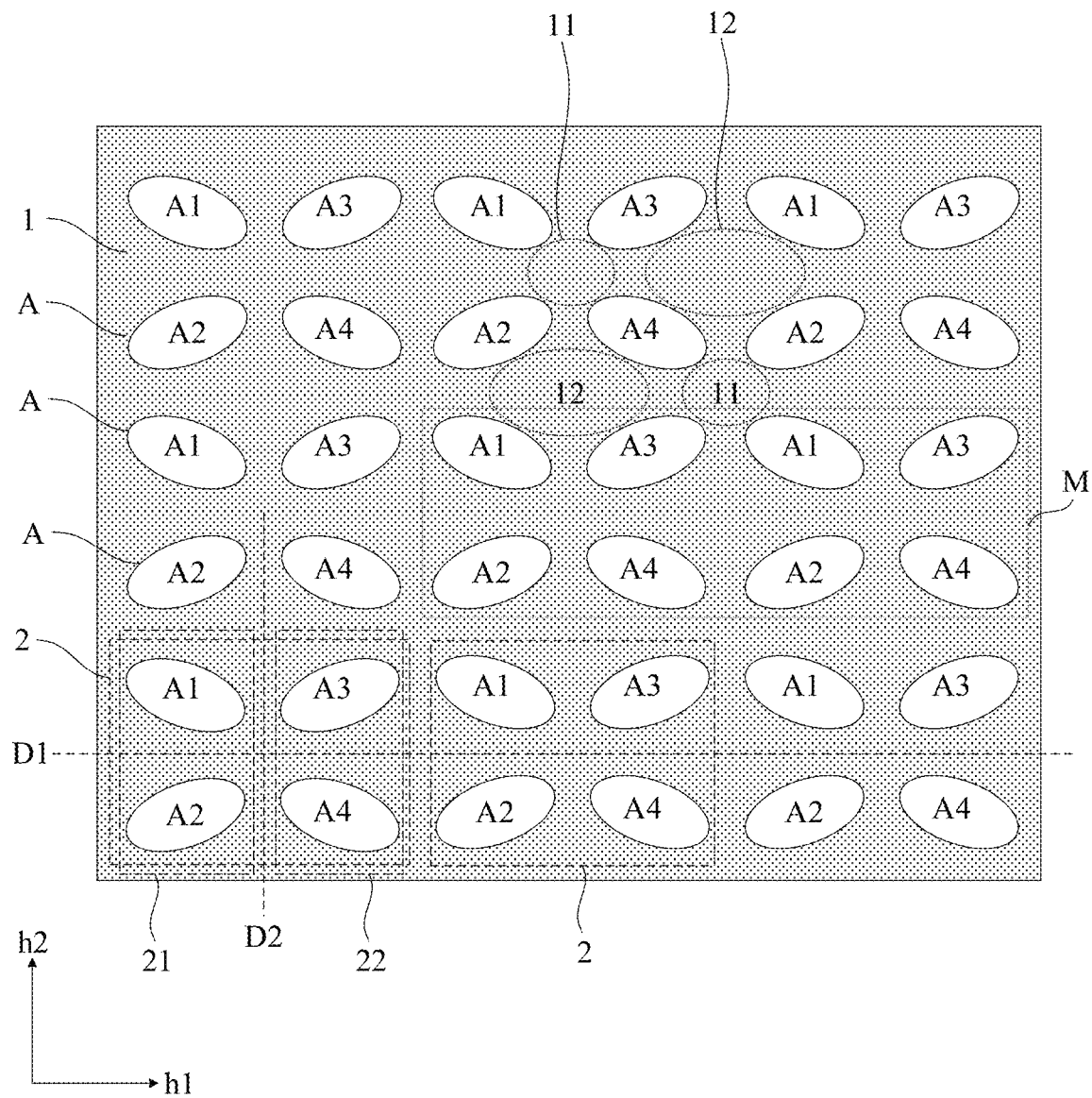
FIG. 2 is an enlarged view of an N area of FIG. 1.
Figure 3:
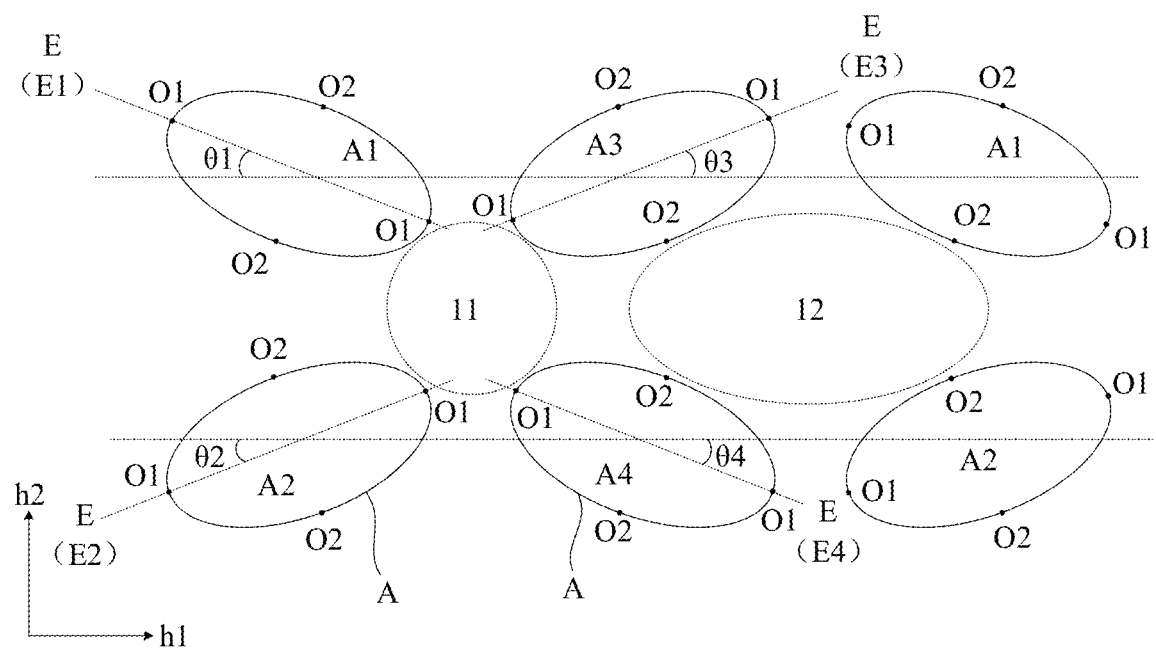
FIG. 3 is an enlarged view of an M area of FIG. 2.

FIG. 1 is a top view of a display panel according to an embodiment of the present disclosure; FIG. 2 is an enlarged view of an N area of FIG. 1; and FIG. 3 is a an enlarged view of an M area of FIG. 2. As shown in FIG. 1, FIG. 2 and FIG. 3, embodiments of the present disclosure provide a display panel. The display panel includes a display area 01 and a border area 02. The display area 01 includes an optical component arrangement region 011 and a non-optical component arrangement region 012. The optical component arrangement region 011 includes: a light-blocking region 1 and a plurality of light-transmitting region units 2 distributed in rows and columns. Each light-transmitting region unit 2 includes a plurality of light-transmitting regions A. Each light-transmitting region unit 2 includes a first set of light-transmitting regions 21 and a second set of light-transmitting regions 22 arranged along a first direction h1. The first set of light-transmitting regions 21 includes a first light-transmitting region A1 and a second light-transmitting region A2 arranged along a second direction h2, and the second set of light-transmitting regions 22 includes a third light-transmitting region A3 and a fourth light-transmitting region A4 arranged along the second direction h2. The first direction h1 intersects with the second direction h2. Each light-transmitting region A has a length direction E. An angle formed between the length direction E of the light-transmitting region A and the first direction h1 is within a range of 10° to 40°, and the range includes 10° and 40°. In the light-transmitting region unit 2, the length direction E of each light-transmitting region A points to a first light-blocking region 11, which is an area located between the first light-transmitting region A1, the second light-transmitting region A2, the third light-transmitting region A3, and the fourth light-transmitting region A4. The first light-blocking region 11 is surrounded by the first light-transmitting region A1, the second light-transmitting region A2, the third light-transmitting region A3, and the fourth light-transmitting region A4.

For an asymmetric light-transmitting region A, the light-transmitting region A having a length direction means that the light-transmitting region A has the largest dimension in this length direction than in any other direction. If the light-transmitting region A has the same largest dimension in two or more directions, any direction of the two or more directions can be regarded as the length direction in this embodiment of the present disclosure. For the light-transmitting region A having two or more symmetry axes, the light-transmitting region A having the length direction means that the light-transmitting region A has a larger dimension in a direction of one symmetry axis than in a direction of any other symmetry axis. In this case, the direction of the symmetry axis in which the light-transmitting region A has the larger dimension is the length direction of the light-transmitting region A. For the light-transmitting region A having one symmetry axis, a dimension of the light-transmitting region A in a direction of the symmetry axis is defined as Q. In a direction perpendicular to the symmetry axis, if a dimension of the light-transmitting region A at any position is smaller than Q, the direction of the symmetry axis is the length direction of the light-transmitting region A. In the direction perpendicular to the symmetry axis, if the dimension of the light-transmitting region A is larger than Q, definition of the length direction of the light-transmitting region A is the same as definition of the length direction of the asymmetric light-transmitting region A. For example, for an elliptical light-transmitting region A, the length direction is an extension direction of its long axis. In a light-transmitting region unit 2, the length direction of each light-transmitting region A points to a middle position of the light-transmitting region unit 2, which is a position located between the first light-transmitting region A1, the second light-transmitting region A2, the third light-transmitting region A3 and the fourth light-transmitting region A4. An angle formed between the length direction E of the light-transmitting region A and the first direction h1 refers to the minimum angle formed therebetween, for example, an acute angle. As shown in FIG. 3, the angle formed between the length direction E1 of the first light-transmitting region A1 and the first direction h1 is θ1, the angle formed between the length direction E2 of the second light-transmitting region A2 and the first direction h1 is θ2, the angle formed between the length direction E3 of the third light-transmitting region A3 and the first direction h1 is θ3, and the angle formed between the length direction E4 of the fourth light-transmitting region A4 and the first direction h1 is θ4. In the light-blocking region 1, light cannot pass through the display panel. In order to achieve an image display function, light-emitting devices may be provided in the light-blocking region 1. Meanwhile, a display panel film layer in the light-transmitting region A is removed or formed by a light-transmitting material, for example, a non-light-blocking metal material, so that light can pass through the light-transmitting region A. In this embodiment of the present disclosure, the light-transmitting region A has the length direction, and a diffraction peak during light transmission can be reduced by setting an angle with the length direction of the light-transmitting region A, thereby reducing a light diffraction degree of the light-transmitting region.

Figure 4:
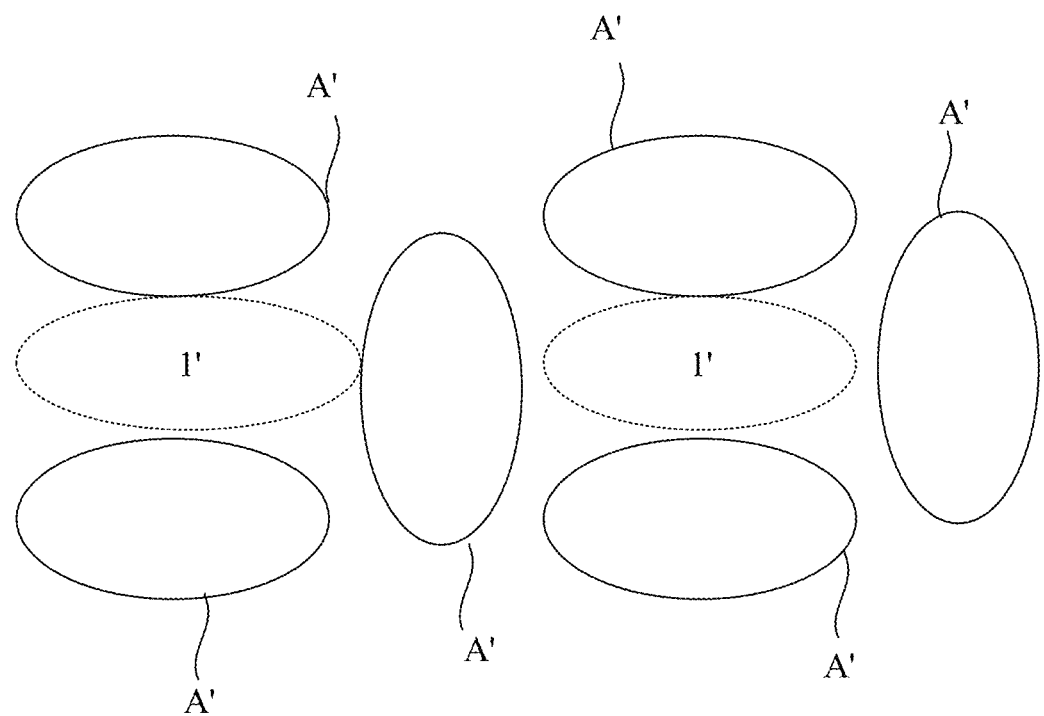
FIG. 4 illustrates an arrangement of light-transmitting regions in a comparative example.
Figure 5:
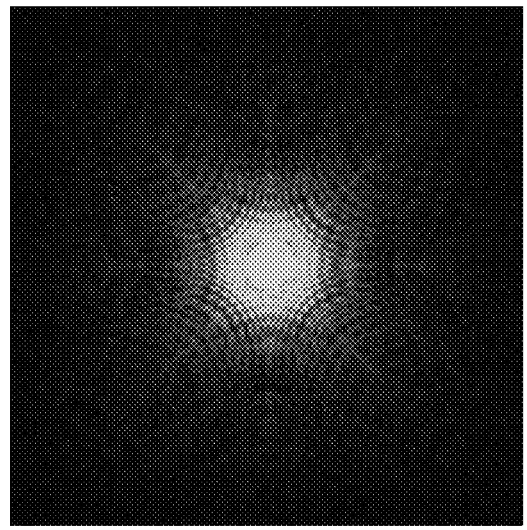
FIG. 5 illustrates a simulation result of light transmission in the comparative example of FIG. 4.
Figure 6:
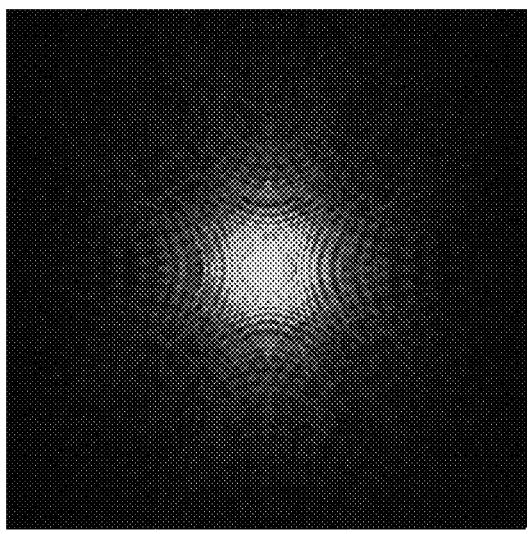
FIG. 6 illustrates a simulation result of light transmission with an arrangement of light-transmitting regions according to an embodiment of the present disclosure.

The effects of the embodiments of the present disclosure will be further described in the following through simulation results of an arrangement of light-transmitting regions according to an embodiment of the present disclosure and an arrangement of light-transmitting regions in a comparative example. FIG. 4 illustrates an arrangement of light-transmitting regions in a comparative example; FIG. 5 illustrates a simulation result of light transmission in the comparative example in FIG. 4; and FIG. 6 illustrates a simulation result of light transmission with an arrangement of light-transmitting regions according to an embodiment of the present disclosure. In the comparative example, light-transmitting regions A' and light-blocking regions 1' are arranged as shown in FIG. 4. As shown in FIG. 4 to FIG. 6, by comparing FIG. 5 with FIG. 6, it is known that with the arrangement of light-transmitting regions in this embodiment of the present disclosure, the angle formed between the length direction E of the light-transmitting region A and the first direction h1 is within a range of 10° to 40°, which can reduce the light diffraction degree of the light-transmitting region.

For the display panel in this embodiment of the present disclosure, the light-transmitting region has a length direction, and an angle formed between the length direction of the light-transmitting region and the first direction is within a range of 10° to 40°. In the light-transmitting region unit, the length direction of each light-transmitting region points to the area surrounded by the first light-transmitting region, the second light-transmitting region, the third light-transmitting region, and the fourth light-transmitting region. Through the arrangement of light-transmitting regions and angle setting of the length direction of the light-transmitting region, the light diffraction degree of the light-transmitting region can be reduced, thereby improving an imaging effect of the front camera through the light-transmitting region.

In an example, the angle formed between the length direction E of the light-transmitting region A and the first direction h1 is within a range of 25° to 35°, and the range includes 25° and 35°. According to a result of a simulation experiment, under such angle, the light diffraction degree of the light-transmitting region can be further reduced.

Figure 7:
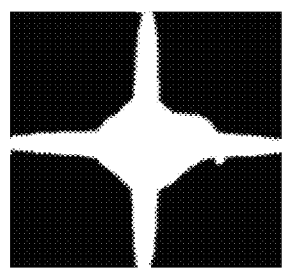
FIG. 7 illustrates a simulation result of light transmission of a rectangular light-transmitting region in the related art.

In an example, in a direction perpendicular to a plane of the display panel, an edge contour of the light-transmitting region A is of an elliptical shape. In the related art, the light-transmitting region generally has a rectangular shape for implementing an under-screen camera function, and the rectangular shape has a vertical edge. As shown in FIG. 7, which illustrates a simulation result of light transmission of a rectangular light-transmitting region in the related art, during a light transmission process, the rectangular light-transmitting region will result in two strong diffraction peaks. In this embodiment of the present disclosure, an edge contour of the light-transmitting region A is of an elliptical shape. As shown in FIG. 6, the elliptical light-transmitting region generates a plurality of weak diffraction peaks in different directions, thereby further reducing the light diffraction degree of the light-transmitting region.

Figure 8:
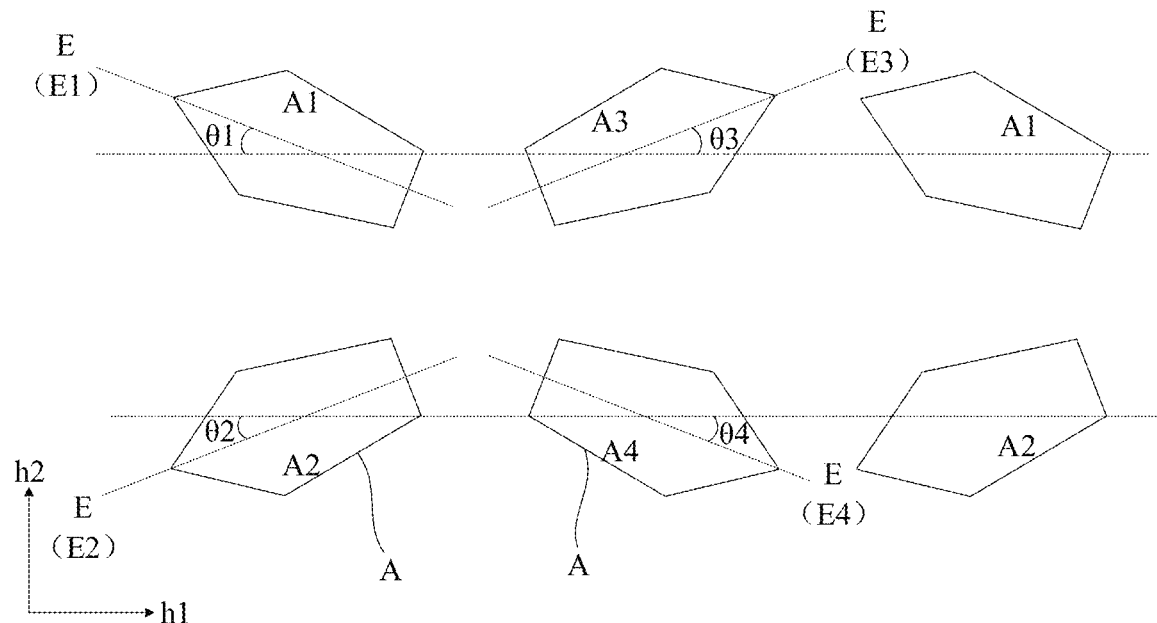
FIG. 8 illustrates another arrangement of light-transmitting regions according to an embodiment of the present disclosure.
Figure 9:
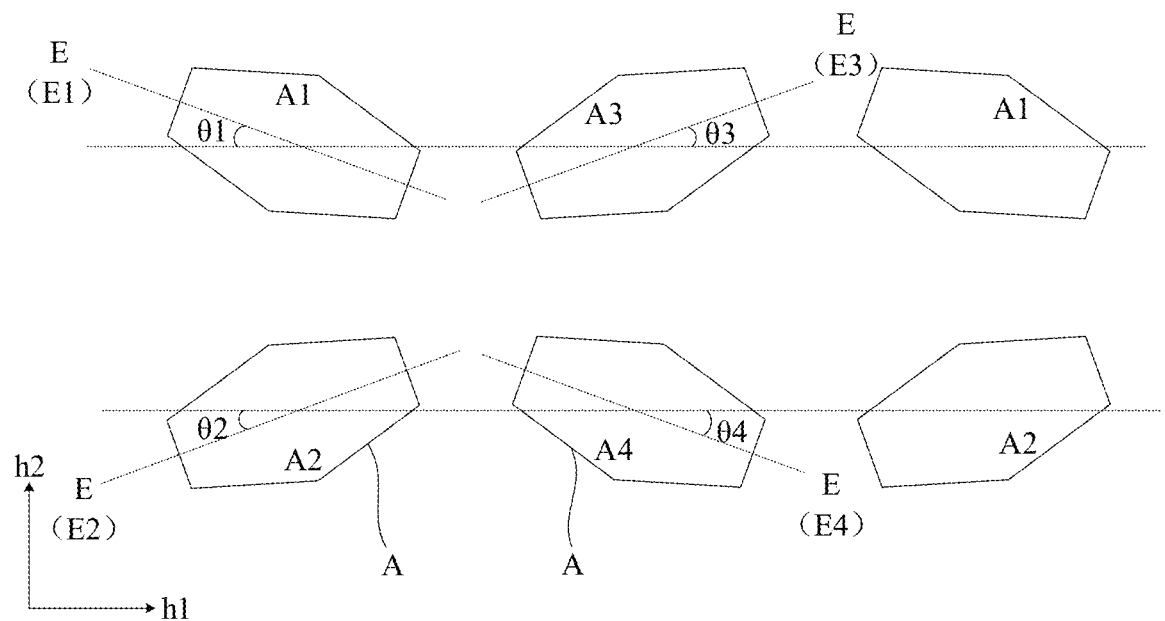
FIG. 9 illustrates still another arrangement of light-transmitting region according to an embodiment of the present disclosure.

FIG. 8 illustrates another arrangement of light-transmitting regions according to an embodiment of the present disclosure, and FIG. 9 illustrates still another arrangement of light-transmitting region according to an embodiment of the present disclosure. In an example, as shown in FIG. 8 and FIG. 9, in the direction perpendicular to the plane of the display panel, the edge contour of the light-transmitting region A is of a polygonal shape having n sides, where n is a positive integer greater than or equal to 5.

In addition to setting the edge contour of the light-transmitting region A to be of an elliptical shape, as shown in FIG. 8 and FIG. 9, the edge contour of the light-transmitting region A can be set to be of a polygonal shape having five or more sides. Compared with the elliptical shape, a manufacturing process for the polygonal shape is simpler and the cost thereof is lower while achieving an effect of an approximate elliptical shape. For example, the edge contour of the light-transmitting region A shown in FIG. 8 has a pentagonal shape, which is a shape having one symmetry axis. In a direction perpendicular to the symmetry axis, the dimension of the light-transmitting region A at any position is smaller than the dimension of the light-transmitting region A in a direction of the symmetry axis, so the symmetry axis of the pentagonal shape is defined as the length direction. For example, the edge contour of the light-transmitting region A shown in FIG. 9 has a hexagonal shape, which has two symmetry axes. In this case, a direction of the longer symmetry axis of the hexagonal shape is defined as the length direction.

In an example, as shown in FIG. 2 and FIG. 3, each light-transmitting region A includes two first positions O1 opposite to each other in the length direction E and two second positions O2 opposite to each other in a width direction different from the length direction. The light-blocking region 1 includes a first light-blocking region 11 and a second light-blocking region 12. The first light-blocking region 11 is surrounded by the respective first positions 01 of the first light-transmitting region A1, the second light-transmitting region A2, the third light-transmitting region A3, and the fourth light-transmitting region A4. The first light-blocking region 11 is provided with L first light-emitting devices T1. The second light-blocking region 12 is surrounded by the respective second positions O2 of the first light-transmitting region A1, the second light-transmitting region A2, the third light-transmitting region A3, and fourth light-transmitting region A4. The second light-blocking region 12 is provided with X first pixel driving circuits and M second light-emitting devices T2. Each of the first light-emitting device T1 and the second light-emitting device T2 is electrically connected to the first pixel driving circuit, where X>M.

Figure 10:
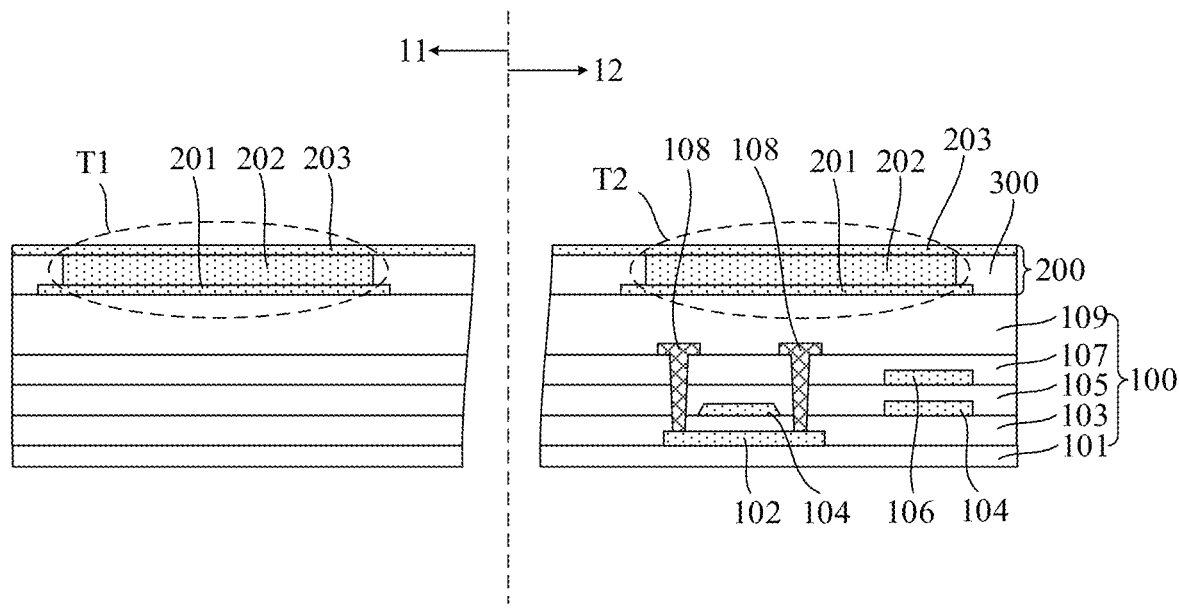
FIG. 10 is a schematic cross-sectional view of a partial structure of a display panel in a light-blocking region according to an embodiment of the present disclosure.

FIG. 10 is a schematic cross-sectional view of a partial structure of a display panel in a light-blocking region according to an embodiment of the present disclosure. As shown in FIG. 2, FIG. 3 and FIG. 10, the display panel may include a circuit film layer 100 and a light-emitting device film layer 200. The circuit film layer 100 may include a substrate layer 101, a semiconductor layer 102, a gate insulation layer 103, a gate metal layer 104, a first interlayer insulation layer 105, a capacitor metal layer 106, a second interlayer insulation layer 107, a source-drain metal layer 108, and a planarization layer 109 that are stacked sequentially. A structure in the circuit film layer 100 is configured to form a structure including a pixel driving circuit, so as to drive the light-emitting device. The semiconductor layer 102 can be used to form an active layer of a transistor. The gate metal layer 104 can be used to form a gate electrode of the transistor and one electrode plate of a capacitor, and the capacitor metal layer 106 can be used to form the other electrode plate of the capacitor. The source-drain metal layer 108 can be used to form source and drain electrodes of the transistor and a metal line. The transistor and the capacitor can be used to form the pixel driving circuit. The light-emitting device film layer 200 may include a pixel definition layer 300 and a light-emitting device. The light-emitting device may include an anode 201, an organic light-emitting layer 202, and a cathode 203 that are stacked sequentially. In an operation process of the display panel, a voltage can be respectively applied to the anode 201 and the cathode 203, so that electrons and holes are injected into the organic light-emitting layer 202 to emit light in combination, thereby achieving display of the sub-pixel. The pixel definition layer 300 may be provided with a plurality of apertures, and each aperture may correspond to one light-emitting device. The organic light-emitting layer 202 may be located in the aperture corresponding to the pixel definition layer 300. The aperture defines an area of the organic light-emitting layer 202, i.e., a light-emitting area of the light-emitting device. Each pixel driving circuit may correspond to a respective one light-emitting device, so as to drive the light-emitting device to emit light. In this embodiment of the present disclosure, due to the arrangement of light-transmitting regions A, the light-blocking region 1 has different area distributions at different positions in the optical component arrangement region 011. Here, an area of the first light-blocking region 11 is smaller than an area of the second light-blocking region 12. Therefore, in order to prevent the pixel driving circuit from possibly blocking the light-transmitting region A, the first light-blocking region 11 having the smaller area may be provided with no pixel driving circuit or a smaller number of pixel driving circuits, and at least part of the first pixel driving circuit corresponding to the first light-emitting device T1 is arranged in the second light-blocking region 12 having the larger area. That is, the second light-blocking region 12 is provided with the first pixel driving circuit for driving the first light-emitting device T1 and the first pixel driving circuit for driving the second light-emitting device T2, so as to reduce a space occupied by the first pixel driving circuit for driving the first light-emitting device T1 in the first light-blocking region 11 to emit light, thereby reducing a risk of the light-transmitting region being blocked by a non-light-transmitting structure in the first light-blocking region 11.

In an implementable manner, each first light-emitting device T1 arranged in the first light-blocking region 11 is driven by the first pixel driving circuit arranged in the second light-blocking region 12 (e.g., only by the first pixel driving circuit arranged in the second light-blocking region 12). In this way, a display function of the pixel in the first light-blocking region 11 having the smaller area can be achieved by the first light-emitting device T1, and the first pixel driving circuit which easily occupies a larger space is arranged in the second light-blocking region 12 having the larger area. In this way, the space occupied by the first pixel driving circuit for driving the first light-emitting device T1 in the first light-blocking region 11 to emit light can be reduced, thereby reducing the risk of the light-transmitting region being blocked by the non-light-transmitting structure in the first light-blocking region 11.

In an example, $X \geq L+M$.

In an implementable manner, each light-emitting device arranged in the first light-blocking region 11 is driven by the pixel driving circuit arranged in the second light-blocking region 12 (e.g., only by the pixel driving circuit arranged in the second light-blocking region 12). In one non-limiting example, the first light-blocking region 11 is provided with only three first light-emitting devices T1, that is, L=3, and the first light-blocking region 11 is provided with no pixel driving circuit. Meanwhile, the second light-blocking region 12 is provided with six second light-emitting devices T2 and nine first pixel driving circuits, that is, X=9 and M=6. In the nine first pixel driving circuits, three of them are respectively connected to the three first light-emitting devices T1 arranged in the first light-blocking region 11, and the remaining six are respectively connected to the six second light-emitting devices T2 arranged in the second light-blocking region 12. In other implementable manners, X may be greater than 9. That is, in a same second light-blocking region 12, in addition to the six first pixel driving circuits for driving the six light-emitting devices arranged in the second light-blocking region 12 and the three other first pixel driving circuits for driving the three light-emitting devices arranged in one first light-blocking region 11, an additional first pixel driving circuit is provided to drive the light-emitting device arranged in another first light-blocking region 11. It should be noted that the light-blocking region 1 includes a plurality of first light-blocking regions 11 and a plurality of second light-blocking regions 12. The first pixel driving circuits arranged in a same second light-blocking region 12 can be used to respectively drive the first light-emitting devices T1 arranged in multiple first light-blocking regions 11, and different first light-emitting devices T1 arranged in a same first light-blocking region 11 may be respectively driven by first pixel driving circuits arranged in multiple second light-blocking regions 12. That is, the first light-blocking region 11 having the smaller area is provided with only the light-emitting device for achieving the display function and with no pixel driving circuit, and the light-emitting device arranged in the first light-blocking region 11 is driven by the pixel driving circuit arranged in the second light-blocking region 12. In this way, a space occupied by the pixel driving circuit in the first light-blocking region 11 can be reduced, thereby reducing the risk of the light-transmitting region being blocked by the non-light-transmitting structure in the first light-blocking region 11.

It should be noted that, the non-optical component arrangement region 012 shown in FIG. 1 is provided with light-emitting devices for achieving light emission and display function, but may not include any light-transmitting region. In this way, all available space can be used for arranging the light-emitting devices, so a density of light-emitting devices (i.e., a pixel density) in the non-optical component arrangement region 012 is larger than a density of light-emitting devices in the optical component arrangement region 011. For example, a ratio of the density of light-emitting devices in the non-optical component arrangement region 012 to the density of light-emitting devices in the optical component arrangement region 011 is 4:1, 6:1, or 9:1. In an example, an arrangement density of first light-emitting devices T1 in the first light-blocking region 11 is the same as an arrangement density of second light-emitting devices T2 in the second light-blocking region 12, and the same arrangement density of light-emitting devices can allow the light-blocking regions 1 at different positions to achieve a similar display effect.

Figure 11:
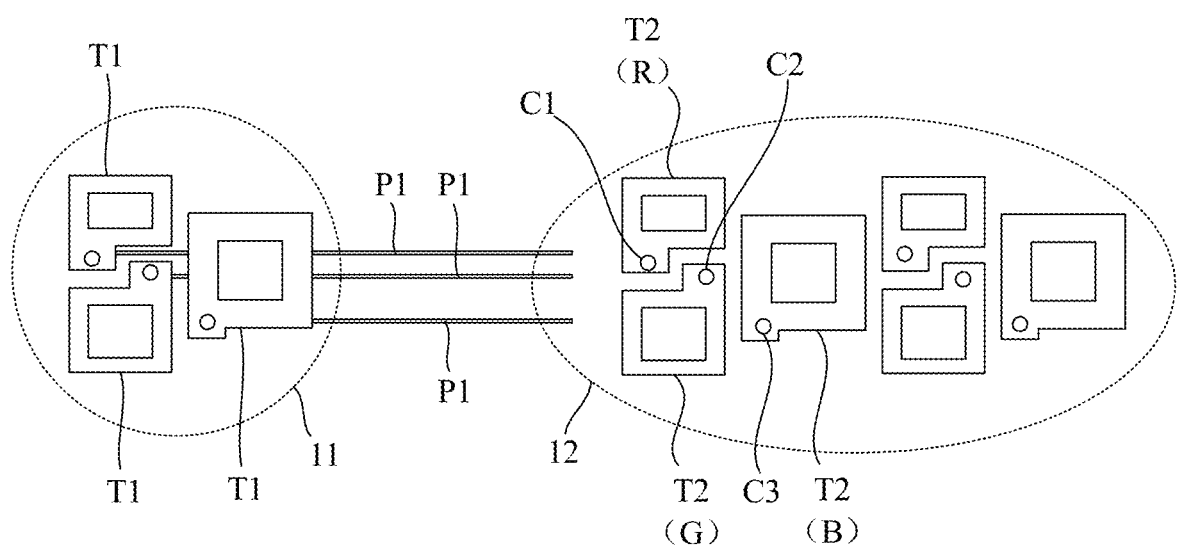
FIG. 11 is an enlarged view of a partial structure of another display panel in a light-blocking region according to an embodiment of the present disclosure.

FIG. 11 is an enlarged view of a partial structure of a display panel in a light-blocking region according to an embodiment of the present disclosure. In an example, as shown in FIG. 11, the anode 201 of the first light-emitting device T1 is electrically connected to the corresponding first pixel driving circuit through a first metal line P1. In the direction perpendicular to the plane of the display panel, an orthographic projection of the first metal line P1 is located between two adjacent light-transmitting regions.

The first pixel driving circuit needs to be electrically connected to the anode of the first light-emitting device T1 through the first metal line P1 so as to provide a required driving current to the first light-emitting device T1. Since the first light-emitting device T1 is far from the corresponding first pixel driving circuit, the first metal line P1 needs to pass through an area between two light-transmitting regions so as to achieve an electrical connection therebetween. It should be noted that in FIG. 11, a specific connection manner between the first metal line P1 and the first pixel driving circuit in the second light-blocking region 12 is omitted. In addition, referring to FIG. 10, the first metal line P1 may be made of any metal material layer in the circuit film layer 100, or may be directly formed by a metal layer where the anode 201 is located. In addition, in a process of connecting the first light-emitting device T1 arranged in the first light-blocking region 11 and the first pixel driving circuit arranged in the second light-blocking region 12, the first metal line P1 may need to pass through other devices or signal lines. In this process, if the first metal line P1 interferes with other signal lines or devices, the first metal line P1 may achieve bridging by using a material in other metal layer. The orthographic projection of the first metal line P1 is located between two adjacent light-transmitting regions, which can prevent the metal line from blocking the light-transmitting region, thereby increasing light transmittance of the light-transmitting region and reducing diffraction due to being blocked by the metal line.

In an example, as shown in FIG. 2, in the first set of light-transmitting regions 21, the first light-transmitting region A1 and the second light-transmitting region A2 are symmetrically arranged about a straight line (e.g., an axis) extending along the first direction h1. For example, in the first set of light-transmitting regions 21 located at the lowest position of FIG. 2, the first light-transmitting region A1 and the second light-transmitting region A2 are symmetrically arranged about D1. In the second set of light-transmitting regions 22, the third light-transmitting region A3 and the fourth light-transmitting region A4 are symmetrically arranged about a straight line extending along the first direction h1. For example, in the second set of light-transmitting regions 22 located at the lowest position of FIG. 2, the third light-transmitting region A3 and the fourth light-transmitting region A2 are symmetrically arranged about D2. In the light-transmitting region unit 2, the first set of light-transmitting regions 21 and the second set of light-transmitting regions 22 are symmetrically arranged about a straight line extending along the second direction h2. For example, in the light-transmitting region unit 2 located at the leftmost position of FIG. 2, the first set of light-transmitting regions 21 and the second set of light-transmitting regions 22 are symmetrically arranged about D2. With such a symmetrical arrangement of the light-transmitting regions, the angle formed between the length direction E of each light-transmitting region A and the first direction h1 is identical, and thus a process and design thereof are relatively simple.

Figure 12:
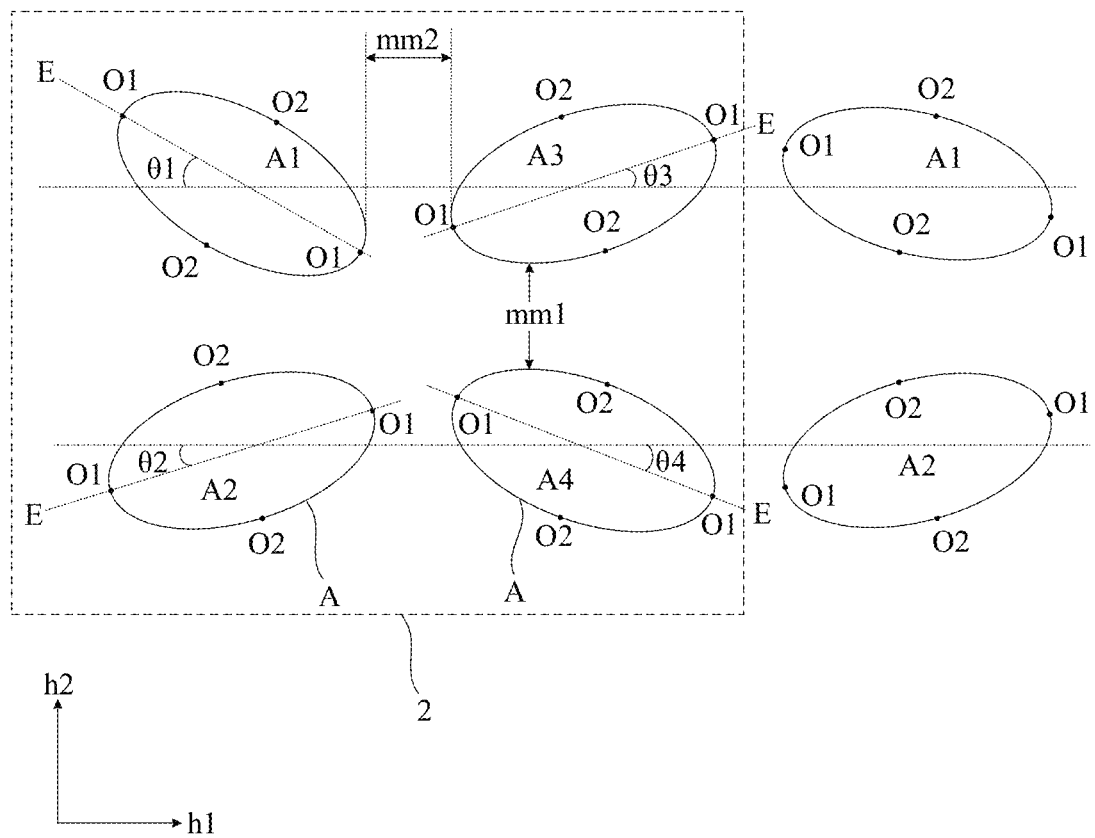
FIG. 12 illustrates another arrangement of light-transmitting regions in an embodiment of the present disclosure.

FIG. 12 illustrates an arrangement of another light-transmitting region in an embodiment of the present disclosure. In an example, as shown in FIG. 12, in a same light-transmitting region unit 2, the angle formed between the length direction E of any light-transmitting region A and the first direction h1 is different from the angle formed between the length direction E of another light-transmitting region A and the first direction h1, that is, θ1≠θ2≠θ3≠θ4. With such an asymmetric arrangement of the light-transmitting region, an enhancement of the diffraction peak caused by the symmetrical arrangement can be further reduced, thereby further reducing the light diffraction degree.

In an example, a ratio of a length of a long axis to a length of a short axis of each light-transmitting region A is greater than 1 and smaller than or equal to 1.5. The light-transmitting region A of an elliptical shape has a long axis and a short axis. If the ratio of the length of the long axis to the length of the short axis is relatively large, a diffraction peak in a direction of the long axis may be enhanced due to the long axis. Therefore, according to research results, matching the light-transmitting region A having such dimension design with the various arrangements described in the above embodiments can further reduce the light diffraction degree.

In an example, the length of the short axis is greater than or equal to 80 μm, that is, a distance between two second positions O2 of a same light-transmitting region A is greater than or equal to 80 μm. The light diffraction is related to a dimension of an aperture or a gap into which the light is irradiated. However, once the ratio of the length of the long axis to the length of the short axis of the light-transmitting region A having the elliptical shape is determined, the length of the short axis determines the minimum dimension of the light-transmitting region A. The smaller minimum dimension of the light-transmitting region A leads to the larger light diffraction range. Therefore, according to research results, setting the length of the short axis to be greater than or equal to 80 μm can further reduce the light diffraction degree.

In an example, for any two adjacent light-transmitting regions A, the shortest distance therebetween is within a range of 10 μm to 50 μm, and the range includes 10 μm and 50 μm. The shortest distance between two light-transmitting regions A refers to the shortest distance between counter edges of the two light-transmitting regions A. For example, in the structure as shown in FIG. 12, the shortest distance between the third light-transmitting region A3 and the fourth light-transmitting region A4 that are adjacent to each other is mm1, where 10 μm≤mm1≤50 μm. The shortest distance between the first light-transmitting region A1 and the third light-transmitting region A3 that are adjacent to each other is mm2, where 10 μm≤mm2≤50 μm. On the one hand, since the light-transmitting regions A are arranged in a certain regularity, when the distance between adjacent light-transmitting regions A is small, it is easier to overlap and enhance the diffraction peaks formed by different light-transmitting regions A, so the shortest distance between any two adjacent light-transmitting region As is set to be greater than or equal to 10 μm. On the other hand, if the distance between adjacent light-transmitting regions A is relatively large, the light will be blocked greatly, which will result in, for example, a poor imaging effect when the imaging function is implemented through the light-transmitting region A. Therefore, in order to take into account a light transmission effect, the shortest distance between any two adjacent light-transmitting regions A is set to be smaller than or equal to 50 μm.

In an example, as shown in FIG. 11, the second light-emitting devices T2 include a red light-emitting device R, a green light-emitting device G, and a blue light-emitting device B. The anode of the red light-emitting device R is electrically connected to the corresponding first pixel driving circuit via a first through hole C1, the anode of the green light-emitting device G is electrically connected to the corresponding first pixel driving circuit via the second through hole C2, and the anode of the blue light-emitting device B is electrically connected to the corresponding first pixel driving circuit via the third through hole C3. In the direction perpendicular to the plane of the display panel, the first through hole C1, the second through hole C2, and the third through hole C3 are not located in a same straight line.

Figure 13:
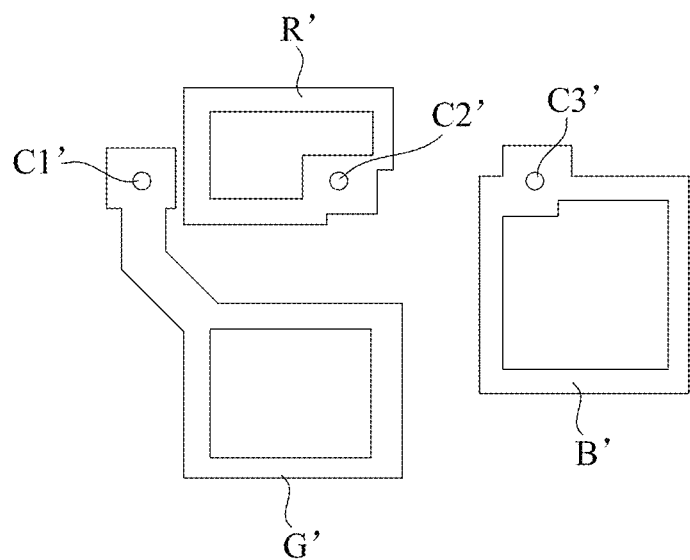
FIG. 13 is a schematic diagram illustrating an arrangement of different light-emitting devices in a same pixel in the related art.

The red light-emitting device R, the green light-emitting device G, and the blue light-emitting device B are used to constitute one pixel. FIG. 13 is a schematic diagram illustrating an arrangement of different light-emitting devices in a same pixel in the related art. As shown in FIG. 13, considering a manufacturing process thereof, the first through hole C1' of the anode of the red light-emitting device R', the second through hole C2' of the anode of the green light-emitting device G', and the third through hole C3' of the anode of the blue light-emitting device B' in a same pixel are located in a same straight line. However, the manufacturing process of the through hole of the anode requires a large space for the anode. In other words, under a same pixel resolution and a same pixel arrangement, aperture areas of some light-emitting devices need to be reduced so as to ensure that the through holes can be set at corresponding positions. Therefore, in order to adapt to such setting of the through holes, an aperture ratio of the light-emitting device will be reduced. For the non-optical component arrangement region 012 in this embodiment of the present disclosure, the pixel arrangement and through hole distribution can be set as shown in FIG. 13, that is, the through holes of the anodes of a same pixel are located in a same straight line. Alternatively, the pixel arrangement and through hole distribution can be set as shown in FIG. 11, that is, the through holes of the anodes of a same pixel are not located in a same straight line. The pixel arrangement and through hole distribution can be set according to actual demands. It can be seen from a comparison between FIG. 11 and FIG. 13 that, in this embodiment of the present disclosure, the through holes of the anodes of the second light-emitting devices T2 arranged in the second light-blocking region 12 do not need to be located in the same straight line. Thus, the position of the through hole of the anode can be adjusted according to an arrangement of the light-emitting devices, so as to prevent the through hole of the anode from affecting the aperture of the light-emitting device. That is, the aperture ratio of the light-emitting device is increased.

Figure 14:
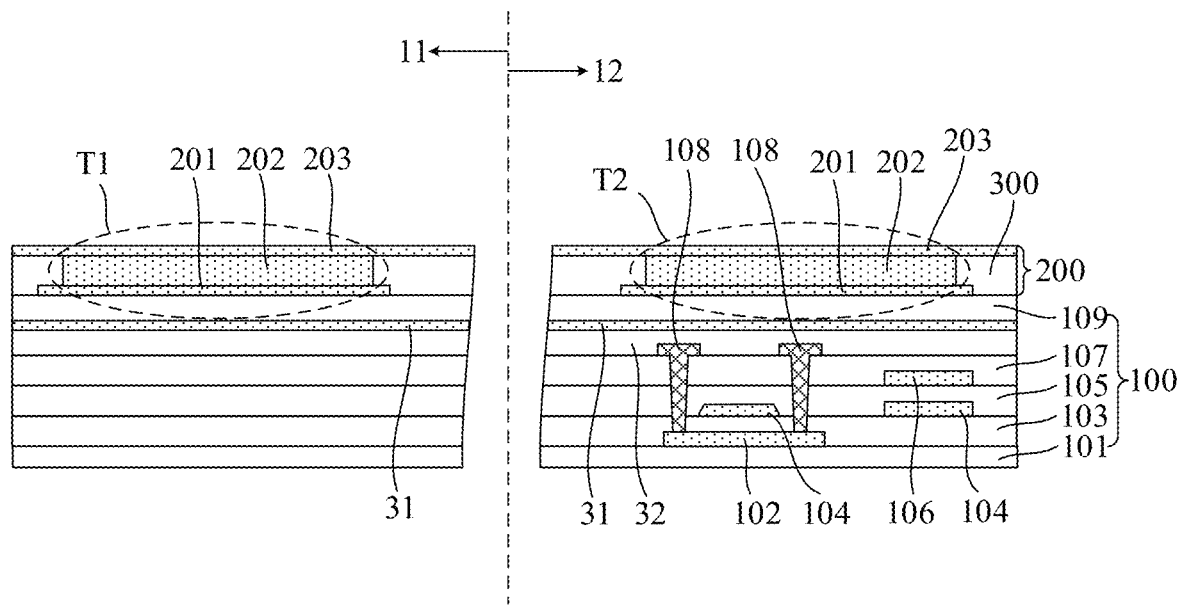
FIG. 14 is another schematic cross-sectional view of a partial structure of a display panel in a light-blocking region according to an embodiment of the present disclosure.

FIG. 14 is another schematic cross-sectional view of a partial structure of a display panel in a light-blocking region according to an embodiment of the present disclosure. In an example, as shown in FIG. 1, FIG. 2, and FIG. 14, the display panel includes a light-blocking metal layer 31, and in the direction perpendicular to the plane of the display panel, the light-blocking metal layer 31 does not overlap the first light-transmitting region A1, the second light-transmitting region A2, the third light-transmitting region A3, and the fourth light-transmitting region A4. The light-blocking metal layer 31 covers each light-blocking region 1.

For example, the light-blocking metal layer 31 may be located between the anode 201 and the source-drain metal layer 108. A light-blocking metal layer 32 is provided between the light-blocking metal layer 31 and the source-drain metal layer 108, and the planarization layer 109 is located between the light-blocking metal layer 31 and the anode 201. It should be noted that in such a structure, since the anode 201 located above the light-blocking metal layer 31 needs to be electrically connected to the pixel driving circuit, which is located below the light-blocking metal layer 31, through a through hole, the light-blocking metal layer 31 needs to be provided with a hollow area at a position at which the anode 201 is electrically connected to the pixel driving current, so as to avoid an adverse effect of the light-blocking metal layer 31 on the electrical connection. Since the anode 201 is arranged here, even if a hollow area is provided in the light-blocking metal layer 31, a light-blocking effect in the light-blocking region will not be adversely affected. The light-blocking metal layer 31 is configured to block light. In other implementable manners, the light-blocking metal layer may be, for example, provided at a side of the semiconductor layer 102 facing away from the gate metal layer 104. At this position, the light-blocking metal layer has no effect on other devices. The light-blocking metal layer may also be provided between the semiconductor layer 102 and the source-drain metal layer 108. However, it is needed to consider setting a hollow structure such as a through hole in addition to the light blocking, thereby achieving normal electrical connections or capacitance functions of other devices without being affected by the light-blocking metal layer.

Figure 15:
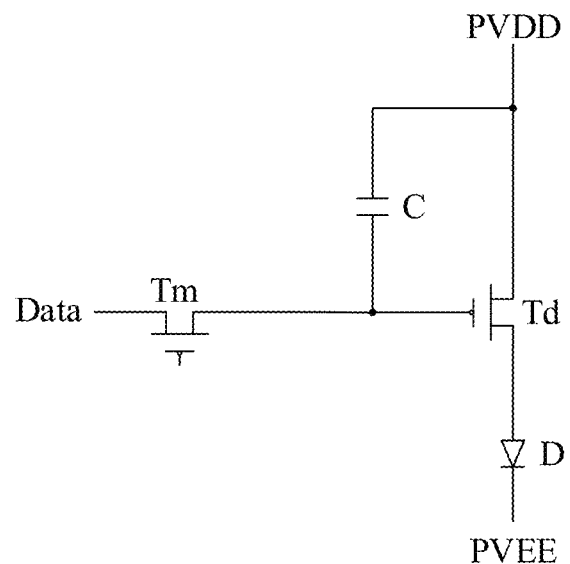
FIG. 15 is a schematic diagram of a pixel driving circuit according to an embodiment of the present disclosure.
Figure 16:
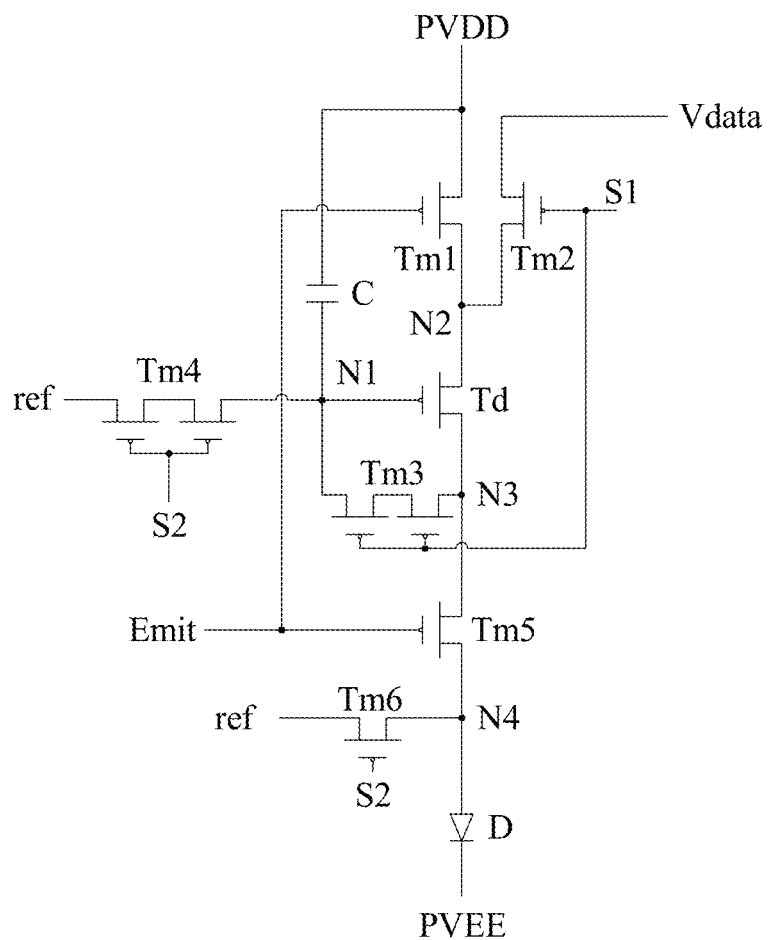
FIG. 16 is a schematic diagram of another pixel driving circuit according to an embodiment of the present disclosure.

FIG. 15 is a schematic diagram of a pixel driving circuit according to an embodiment of the present disclosure. FIG. 16 is a schematic diagram of another pixel driving circuit according to an embodiment of the present disclosure. In an example, as shown FIG. 1, FIG. 2, FIG. 14, FIG. 15 and FIG. 16, the light-blocking metal layer 31 is reused as a first power voltage signal line PVDD.

For example, the pixel driving circuit shown in FIG. 15 may include a 2T1C structure. That is, the pixel driving circuit shown in FIG. 15 may include two transistors and one capacitor. The two transistors are a switching transistor Tm and a driving transistor Td, respectively. The driving transistor Td is connected in series between the first power voltage signal line PVDD and the anode of the light-emitting device D. All pixel driving circuits are electrically connected to a same first power voltage signal line PVDD, and the light-emitting device D is connected in series between the driving transistor Td and a second power voltage signal line PVEE. The pixel driving circuit shown in FIG. 16 may include a 7T1C structure. That is, the pixel driving circuit shown in FIG. 16 may include seven transistors and one capacitor. The pixel driving circuit shown in FIG. 16 includes: a driving transistor Td including a control terminal electrically connected to a first node N1, a first terminal electrically connected to a second node N2, and a second terminal electrically connected to a third node N3; a first switching transistor Tm1 including a first terminal electrically connected to a first power voltage signal line PVDD, a second terminal electrically connected to the first terminal of the driving transistor Td, i.e., the second node N2, and a control terminal electrically connected to a light-emitting control signal line Emit; a second switching transistor Tm2 including a first terminal electrically connected to a data voltage signal line Vdata, a second terminal electrically connected to the first terminal of the driving transistor Td, i.e., the second node N2, and a control terminal electrically connected to a first scan signal terminal S1; a third switching transistor Tm3 including a first terminal electrically connected to the control terminal of the driving transistor Td, i.e., the first node N1, and a second terminal electrically connected to the second terminal of the driving transistor Td, i.e., the third node N3; a fourth switching transistor Tm4 including a first terminal electrically connected to a reference voltage signal line ref, a second terminal electrically connected to the control terminal of the driving transistor Td, i.e., the first node N1, and a control terminal electrically connected to a second scan signal terminal S2; a fifth switching transistor Tm5 including: a first terminal electrically connected to the second terminal of the driving transistor Td, i.e., the third node N3, a second terminal electrically connected to a fourth node N4, and a control terminal electrically connected to the light-emitting control signal line Emit; a sixth switching transistor Tm6 including a first terminal electrically connected to the reference voltage signal line ref, a second terminal electrically connected to the second terminal of the fifth switching transistor Tm5, i.e., the fourth node N4, and a control terminal electrically connected to the second scan signal terminal S2; a light-emitting device D including a first terminal electrically connected to the second terminal of the sixth switching transistor Tm6, i.e., the fourth node N4, and a second terminal electrically connected to a second power voltage signal line PVEE; and a capacitor C including a first terminal electrically connected to the first power voltage signal line PVDD, and a second terminal electrically connected to the control terminal of the driving transistor Td, i.e., the first node N1. Under a same control condition, the closer values of voltages which are transmitted by the first power voltage signal line PVDD to different positions lead to the closer values of driving currents generated by different pixel driving circuits, i.e., the better display uniformity of the display panel. Therefore, in this embodiment of the present disclosure, by using the light-blocking metal layer 31 covering more areas as the first power voltage signal line PVDD, an area of the first power voltage signal line PVDD can be increased. That is, a voltage drop on the first power voltage signal line PVDD is reduced, thereby improving the display uniformity.

In some embodiments, the anode 201 of the second light-emitting device T2 in the second light-blocking region 12 overlaps one first pixel driving circuit (e.g., only one first pixel driving circuit). However, the first pixel driving circuit corresponding to the first light-emitting device T1 in the first light-blocking region 11 is arranged in the second light-blocking region 12, so if a relationship between the light-emitting device in the second light-blocking region 12 and each first pixel driving circuit is set in this way, a smaller number of second light-emitting devices T2 can be provided in the second light-blocking region 12 since the space is occupied by the first pixel driving circuit. Therefore, in an example, as shown in FIG. 11 and FIG. 12, in the second light-blocking region 12, in the direction perpendicular to the plane of the display panel, the anode 201 of the second light-emitting device T2 overlaps at least two first pixel driving circuits.

The anode 201 overlapping the pixel driving circuit refers to the anode 201 overlapping a channel of a transistor in the pixel driving circuit. Since the first pixel driving circuit corresponding to the first light-emitting device T1 in the first light-blocking region 11 is arranged in the second light-blocking region 12, the anode 201 of the second light-emitting device T2 in the second light-blocking region 12 overlaps at least two first pixel driving circuits. For example, in the second light-blocking region 12, one anode 201 overlaps a part of transistors of one first pixel driving circuit and overlaps a part of transistors of another one first pixel driving circuit; or one anode 201 overlaps all transistors of one first pixel driving circuit and overlaps a part of transistors of another one first pixel driving circuit; or one anode 201 overlaps all transistors of two first pixel driving circuits. With such an arrangement, the second light-emitting device T2 and the first pixel driving circuit in the second light-blocking region 12 can make further use of space.

Figure 17:
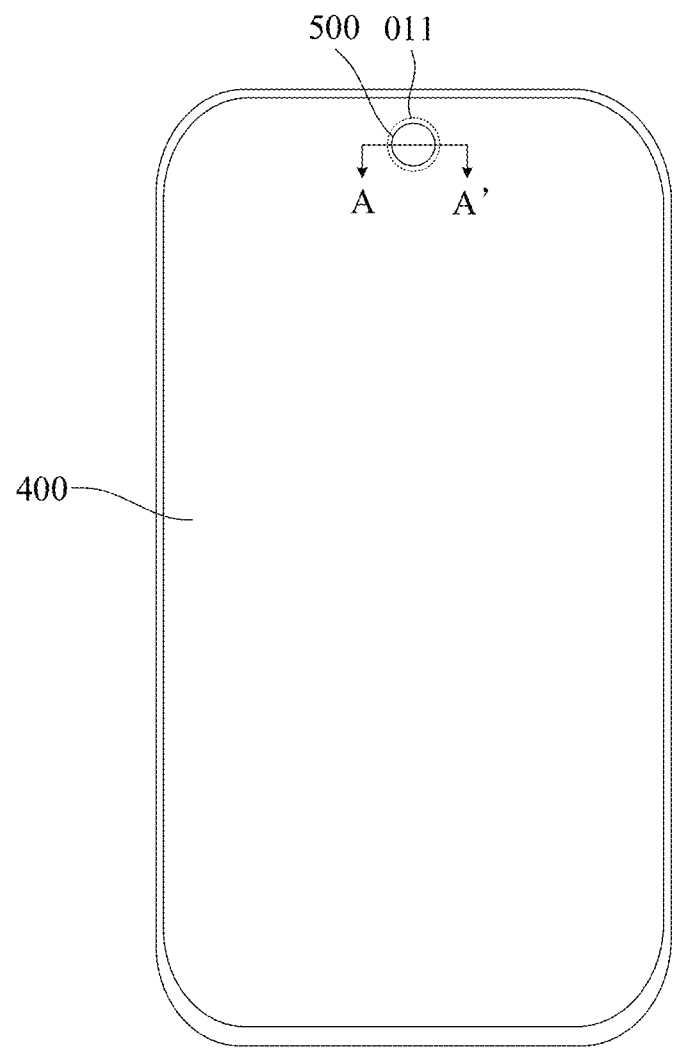
FIG. 17 is a schematic diagram of a structure of a display device according to an embodiment of the present disclosure.
Figure 18:
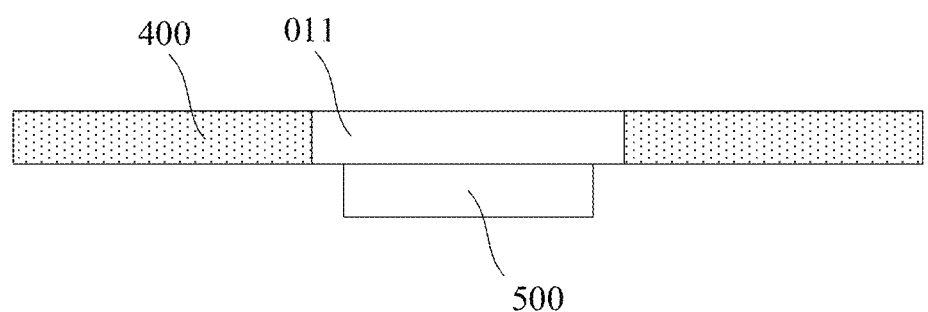
FIG. 18 is a schematic cross-sectional view taken along AA' of FIG. 17.

FIG. 17 is a schematic diagram of a structure of a display device according to an embodiment of the present disclosure. FIG. 18 is a schematic cross-sectional view taken along AA' of FIG. 17. In another aspect, as shown in FIG. 17 and FIG. 18, an embodiment of the present disclosure further provides a display device including the display panel 400 described above and an optical component 500 provided at a position corresponding to the optical component arrangement region 011.

A structure and principle of the display panel 400 are the same as those of the above-mentioned embodiments, and will not be repeated herein. The optical component 500 is located at a side of the display panel 400 facing away from a light-emitting surface. In the optical component arrangement region 011, the display panel 400 may achieve an image display function through the light-emitting device located in the light-blocking region, and achieve light transmission through the light-transmitting region. The display device in this embodiment of the present disclosure may be any electronic device having a display function, such as a touch display screen, a mobile phone, a tablet computer, a notebook computer, an electronic paper book, or a television.

For the display device in this embodiment of the present disclosure, the light-transmitting region has the length direction, and the angle formed between the length direction of the light-transmitting region and the first direction is within a range of 10° to 40°. In the light-transmitting region unit, The length direction of each light-transmitting region points to the area surrounded by the first light-transmitting region, the second light-transmitting region, the third light-transmitting region, and the fourth light-transmitting region. Through an arrangement of the light-transmitting region and angle setting of the length direction of the light-transmitting region, the light diffraction degree of the light-transmitting region can be reduced, thereby improving an imaging effect of the front camera through the light-transmitting region.

In an example, the optical component 500 includes a camera. Through the camera located in the optical component arrangement region 011 and a light transmission function of the light-transmitting region, a front imaging function of the display device can be achieved.

The above-described embodiments are representative embodiments of the present disclosure and are not intended to limit the present disclosure. Any modifications, equivalent substitutions and improvements made within the principle of the present disclosure shall fall into the protection scope of the present disclosure.

Finally, it should be noted that the above-described embodiments are for illustrating the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein without departing from the scope of the present disclosure.

What is claimed is:

1. A display panel, comprising:
a display area comprising an optical component arrangement region,
wherein the optical component arrangement region comprises at least one light-blocking region and a plurality of light-transmitting region units, the plurality of light-transmitting region units is distributed in rows and columns, and each of the plurality of light-transmitting region units comprises a plurality of light-transmitting regions;
wherein each of the plurality of light-transmitting region units comprises a first set of light-transmitting regions and a second set of light-transmitting regions that are arranged along a first direction, the first set of light-transmitting regions comprises a first light-transmitting region and a second light-transmitting region that are arranged along a second direction, and the second set of light-transmitting regions comprises a third light-transmitting region and a fourth light-transmitting region that are arranged along the second direction; and the first direction intersects with the second direction;
wherein each of the plurality of light-transmitting regions has a length direction, and an angle formed between the length direction and the first direction is within a range of 10° to 40°; and
wherein in each of the plurality of light-transmitting region units, the length direction of each of the plurality of light-transmitting regions points to an area surrounded by the first light-transmitting region, the second light-transmitting region, the third light-transmitting region, and the fourth light-transmitting region; and
wherein each of the plurality of light-transmitting regions comprises two first positions that are opposite to each other in the length direction and two second positions that are opposite to each other in a width direction different from the length direction;

wherein the at least one light-blocking region comprises a first light-blocking region and a second light-blocking region; the first light-blocking region is surrounded by one of the two first positions of the first light-transmitting region, one of the two first positions of the second light-transmitting region, one of the two first positions of the third light-transmitting region and one of the two first positions of the fourth light-transmitting region; and the first light-blocking region is provided with L first light-emitting devices, where L is a positive integer;

wherein the second light-blocking region is surrounded by one of the two second positions of the first light-transmitting region, one of the two second positions of the second light-transmitting region, one of the two second positions of a fifth light-transmitting region and one of the two second positions of a sixth light-transmitting region; the second light-blocking region is provided with X first pixel driving circuits and M second light-emitting devices; and each of the L first light-emitting devices and the M second light-emitting devices is electrically connected to one of the X first pixel driving circuits, where X and M are both positive integers and X>M.

2. The display panel according to claim 1, wherein the angle formed between the length direction and the first direction is within a range of 25° to 35°.

3. The display panel according to claim 1, wherein in a direction perpendicular to a plane of the display panel, an edge contour of each of the plurality of light-transmitting regions is of an elliptical shape.

4. The display panel according to claim 1, wherein in a direction perpendicular to a plane of the display panel, an edge contour of each of the plurality of light-transmitting regions is of a polygonal shape having n sides, where n is a positive integer greater than or equal to 5.

5. The display panel according to claim 1, wherein X≤L+M.

6. The display panel according to claim 1, wherein an arrangement density of the L first light-emitting devices in the first light-blocking region is identical to an arrangement density of the M second light-emitting devices in the second light-blocking region.

7. The display panel according to claim 1,
wherein each of the L first light-emitting devices comprises an anode electrically connected to a corresponding one of the X first pixel driving circuits through a first metal line; and
wherein in a direction perpendicular to a plane of the display panel, an orthographic projection of the first metal line is located between two adjacent light-transmitting regions.

8. The display panel according to claim 1,
wherein in the first set of light-transmitting regions, the first light-transmitting region and the second light-transmitting region are symmetrically arranged about a straight line extending along the first direction;
wherein in the second set of light-transmitting regions, the third light-transmitting region and the fourth light-transmitting region are symmetrically arranged about the straight line extending along the first direction; and
wherein in each of the plurality of light-transmitting region units, the first set of light-transmitting regions and the second set of light-transmitting regions are symmetrically arranged about a straight line extending along the second direction.

9. The display panel according to claim 1, wherein in one of the plurality of light-transmitting region units, an angle formed between the length direction of one light-transmitting region of the plurality of light-transmitting regions and the first direction is different from an angle formed between the length direction of another light-transmitting region of the plurality of light-transmitting regions and the first direction.

10. The display panel according to claim 3, wherein for each of the plurality of light-transmitting regions, a ratio of a length of a long axis of the elliptical shape to a length of a short axis of the elliptical shape is greater than 1 and smaller than or equal to 1.5.

11. The display panel according to claim 10, wherein the length of the short axis is greater than or equal to 80 μm.

12. The display panel according to claim 1, wherein a shortest distance between any two adjacent light-transmitting regions of the plurality of light-transmitting regions is within a range of 10 μm to 50 μm.

13. The display panel according to claim 1,
wherein the M second light-emitting devices comprise a red light-emitting device, a green light-emitting device, and a blue light-emitting device; the red light-emitting device comprises an anode electrically connected to a corresponding one of the X first pixel driving circuits via a first through hole, the green light-emitting device comprises an anode electrically connected to a corresponding one of the X first pixel driving circuits via a second through hole, and the blue light-emitting device comprises an anode electrically connected to a corresponding one of the X first pixel driving circuits via a third through hole; and
wherein in a direction perpendicular to a plane of the display panel, the first through hole, the second through hole, and the third through hole are not located in a same straight line.

14. The display panel according to claim 1, comprising a light-blocking metal layer covering each of the at least one light-blocking region in a direction perpendicular to a plane of the display panel.

15. The display panel according to claim 14, wherein the light-blocking metal layer is configured to be reused as a first power voltage signal line.

16. The display panel according to claim 1, wherein in the second light-blocking region, in a direction perpendicular to a plane of the display panel, each of the M second light-emitting devices comprises an anode overlapping at least two of the X first pixel driving circuits.

17. A display device, comprising:
a display panel; and
an optical component,
wherein the display panel comprises a display area, the display area comprising an optical component arrangement region,
wherein the optical component arrangement region comprises at least one light-blocking region and a plurality of light-transmitting region units, the plurality of light-transmitting region units is distributed in rows and columns, and each of the plurality of light-transmitting region units comprises a plurality of light-transmitting regions;
wherein each of the plurality of light-transmitting region units comprises a first set of light-transmitting regions and a second set of light-transmitting regions that are arranged along a first direction, the first set of light-transmitting regions comprises a first light-transmitting region and a second light-transmitting region that are arranged along a second direction, and the second set of light-transmitting region comprises a third light-transmitting region and a fourth light-transmitting region that are arranged along the second direction; and the first direction intersects with the second direction;

wherein each of the plurality of light-transmitting regions has a length direction, and an angle formed between the length direction and the first direction is within a range of 10° to 40°;

wherein in each of the plurality of light-transmitting region units, the length direction of each of the plurality of light-transmitting regions points to an area surrounded by the first light-transmitting region, the second light-transmitting region, the third light-transmitting region, and the fourth light-transmitting region, wherein the optical component is provided at a position corresponding to the optical component arrangement region, wherein each of the plurality of light-transmitting regions comprises two first positions that are opposite to each other in the length direction and two second positions that are opposite to each other in a width direction different from the length direction;

wherein the at least one light-blocking region comprises a first light-blocking region and a second light-blocking region; the first light-blocking region is surrounded by one of the two first positions of the first light-transmitting region, one of the two first positions of the second light-transmitting region, one of the two first positions of the third light-transmitting region and one of the two first positions of the fourth light-transmitting region; and the first light-blocking region is provided with L first light-emitting devices, where L is a positive integer;

wherein the second light-blocking region is surrounded by one of the two second positions of the first light-transmitting region, one of the two second positions of the second light-transmitting region, one of the two second positions of a fifth light-transmitting region and one of the two second positions of a sixth light-transmitting region; the second light-blocking region is provided with X first pixel driving circuits and M second light-emitting devices; and each of the L first light-emitting devices and the M second light-emitting devices is electrically connected to one of the X first pixel driving circuits, where X and M are both positive integers and X>M.

18. The display device according to claim 17, wherein the optical component comprises a camera.

* * * * *